United States Patent [19]

Hayama

[11] Patent Number: 5,416,341

[45] Date of Patent: May 16, 1995

[54] SUBSTRATE FOR A SEMICONDUCTOR DEVICE AND METHOD FOR MANUFACTURING A SEMICONDUCTOR DEVICE FROM THE SUBSTRATE

[75] Inventor: Hiroshi Hayama, Tokyo, Japan

[73] Assignee: NEC Corporation, Tokyo, Japan

[21] Appl. No.: 187,471

[22] Filed: Jan. 28, 1994

[30] Foreign Application Priority Data

Feb. 22, 1993 [JP] Japan .................. 5-031040

[51] Int. Cl.$^6$ ............................. H01L 21/324
[52] U.S. Cl. ........................... 257/59; 257/72; 257/347; 359/82; 437/248
[58] Field of Search ............... 257/59, 72, 347; 359/82

[56] References Cited

U.S. PATENT DOCUMENTS 5,247,375  9/1993  Mochizuki et al. ............... 257/59

FOREIGN PATENT DOCUMENTS 60-136306  7/1985  Japan .
63-261714  10/1988  Japan .
63-292682  11/1988  Japan .
2-199817  8/1990  Japan .
4-4591  1/1992  Japan .
4-34888  2/1992  Japan .
5-211151  8/1993  Japan .

Primary Examiner—Jerome Jackson
Assistant Examiner—Nathan K. Kelley
Attorney, Agent, or Firm—Young & Thompson

[57] ABSTRACT

A silicon-on-insulator (SOI) substrate has an insulating substrate having a glass substrate and an insulating layer formed on the substrate, an array of isolated silicon film pieces formed on a pixel area of the insulating substrate, a meshed silicon film formed on a drive circuit area of the insulating substrate, both the meshed and isolated silicon films being composed of hydrogenated amorphous silicon or polycrystalline silicon. In manufacturing a semiconductor device from the SOI substrate, the meshed silicon film is annealed for recrystallizing selectively from the isolated silicon film pieces by induction heating. A reliable and reproducible semiconductor device for use in LCD is fabricated at a low cost.

8 Claims, 4 Drawing Sheets

FIG. IA
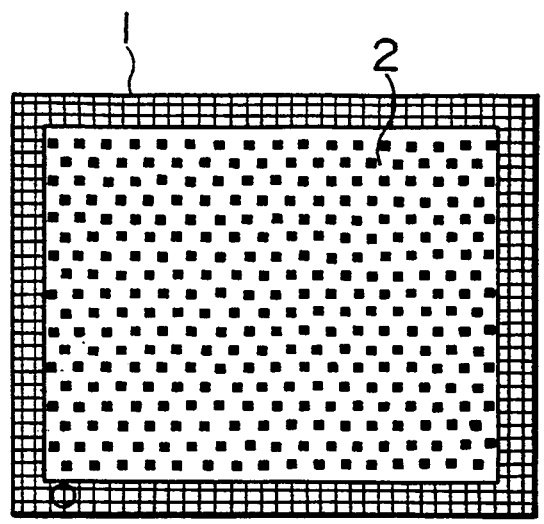
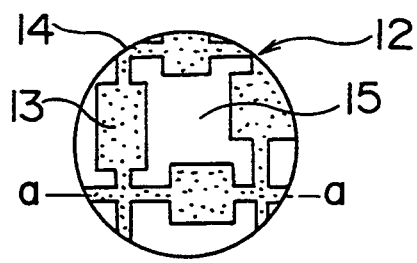
FIG. ID
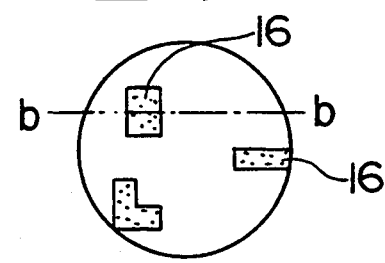
FIG. IE
FIG. IB
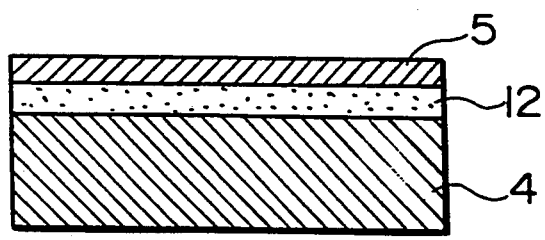
FIG. IC
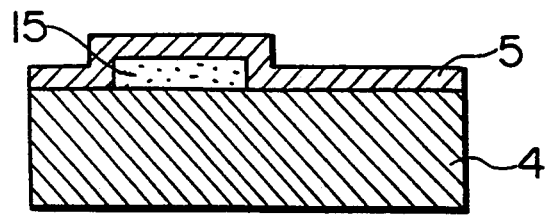

FIG. 2A
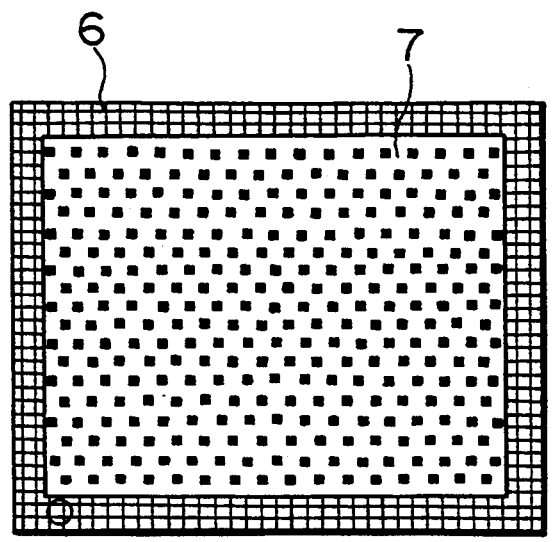
FIG. 2D  FIG. 2E
FIG. 2B
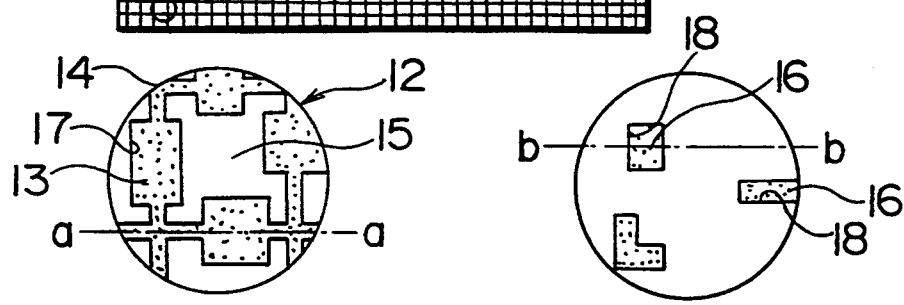
FIG. 2C
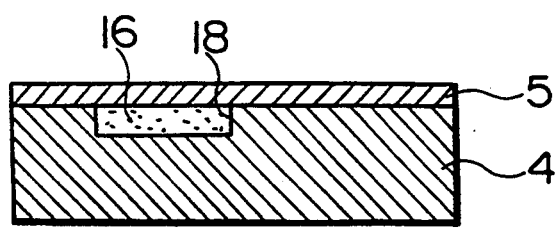

FIG. 3A
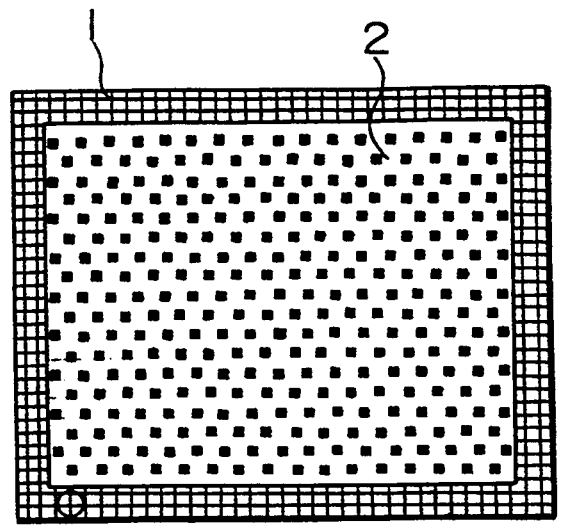
FIG. 3D    FIG. 3E
FIG. 3B
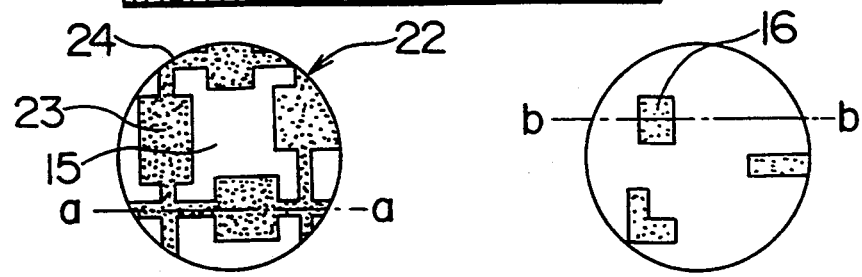
FIG. 3C
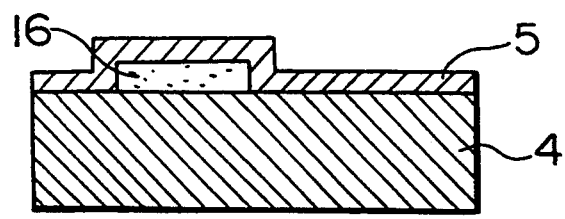

FIG.4A
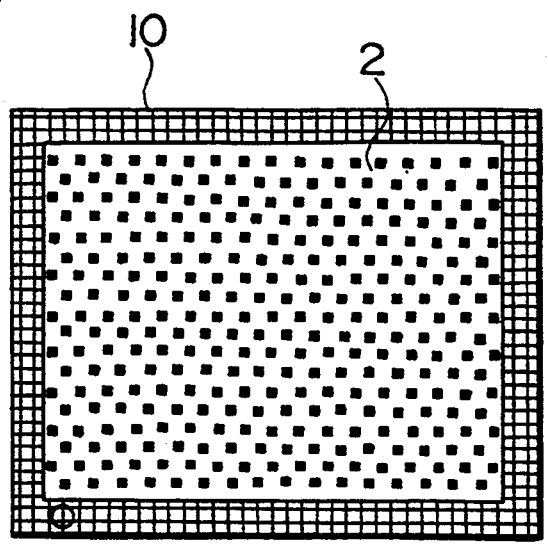
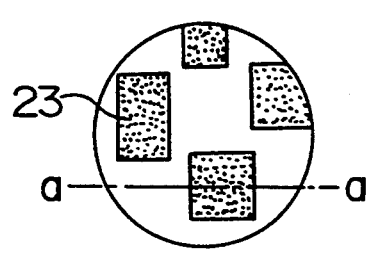
FIG. 4D
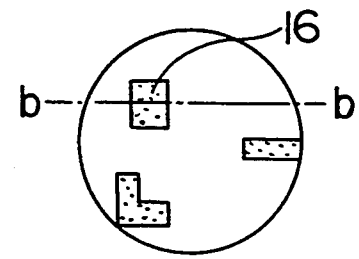
FIG. 4E
FIG.4B
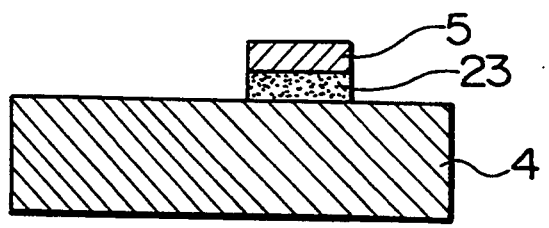
FIG.4C
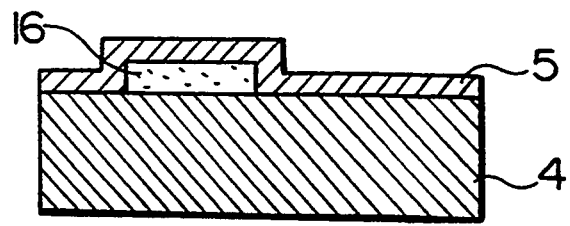

SUBSTRATE FOR A SEMICONDUCTOR DEVICE AND METHOD FOR MANUFACTURING A SEMICONDUCTOR DEVICE FROM THE SUBSTRATE

BACKGROUND OF THE INVENTION

1. Field of the Invention

The present invention relates to a substrate used for manufacturing a semiconductor device and a method for manufacturing the semiconductor device from the substrate. More specifically, it relates to a semiconductor-on-insulator substrate used for fabricating thereon a semiconductor device in which both a semiconductor element having amorphous silicon or polycrystalline silicon active film and a high electron mobility semiconductor element having a higher performance are formed together on a common insulating substrate, and to a method for manufacturing such a semiconductor device from the substrate.

2. Description of Related Art

Such a semiconductor device for use in a high performance liquid crystal display (LCD) is known which has thin film transistors composed of a hydrogenated amorphous silicon active layer formed on a glass substrate in a pixel area. This type of semiconductor device has an advantage that leakage current flowing between the source and drain regions of the thin film transistor is small as a result of employing the hydrogenated amorphous silicon film formed on the glass substrate.

With the semiconductor device as described above, when a drive circuit for driving an array of thin film transistors in the pixel area is also formed of thin film transistors having an amorphous silicon active layer, the drive circuit does not have sufficiently high electron mobility for driving the arrays of the thin film transistors in a high performance. Accordingly, in a conventional high performance LCD, a semiconductor device for a drive circuit formed of transistors having a single crystalline silicon active layer is additionally provided to the semiconductor device having pixel elements. The two semiconductor devices are connected by wires between terminals of both the devices, resulting in a low reliability and a high cost.

Another type of semiconductor device for use in a LCD has an integrated circuit comprising a pixel area and a drive circuit area both having thin film transistors of polycrystalline silicon active layer, which have a higher current drivability than the thin film transistors having a hydrogenated amorphous silicon active layer have. When thin film transistors having polycrystalline silicon active layers are employed in a drive circuit area, however, since the thin film transistors having polycrystalline silicon active layers do not have sufficient high electron mobility, this type of semiconductor devices has drawbacks in that LCD's having a large size cannot be obtained.

Still another type of semiconductor devices for use in a LCD has been proposed. In this type, an array of pixel elements comprising thin film transistors having a hydrogenated amorphous or polycrystalline silicon active layer are disposed on the central area of an insulating substrate and the drive circuit for driving the array of pixel elements and comprising thin film transistors each having a high electron mobility is disposed on the peripheral area of the insulating substrate. This type of semiconductor device is obtained by annealing a semiconductor film composed of hydrogenated amorphous silicon or polycrystalline silicon by use of laser beam scanning on the peripheral area of the substrate.

With the last type of the semiconductor devices as described above, however, annealing by scanning a laser beam costs a large amount of time, so that production cost of the semiconductor device is extremely high due to the low through-put of the annealing, and the uniformity and reproducibility of the semiconductor device are not satisfactory. Moreover, when a semiconductor film of hydrogenated amorphous silicon is exposed to laser-annealing, hydrogen gas contained therein drastically expands, thereby destroying the recrystallized film.

SUMMARY OF THE INVENTION

In view of foregoing, it is an object of the present invention to provide a semiconductor-on-insulator substrate for manufacturing at a relatively low cost and in a good uniformity and reproducibility a semiconductor device for use in a LCD having a drive circuit of a high performance.

It is another object of the present invention to provide a method for fabricating a semiconductor device of the type as described above from the semiconductor-on-insulator substrate according to the present invention.

According to a first aspect of the present invention, there is provided an improved semiconductor-on-insulator substrate on which a semiconductor device having a pixel area and a drive circuit area of high performance can be fabricated. The substrate comprises: an insulating substrate having a main surface including a first area and a second area; an array of isolated semiconductor film pieces formed on the first area; and a meshed semiconductor film having a plurality of meshes therein and formed on the second area.

With the substrate according to the present invention, the meshed semiconductor film can be annealed by induction heating selectively from the array of the isolated semiconductor film pieces, resulting in a high performance of semiconductor elements formed on the second area.

The insulating substrate may have patterned flat depressions in the main surface thereof each for receiving the meshed semiconductor film or the array of the isolated semiconductor film pieces. Further, the first area may be a central area of the substrate and the second area may be a peripheral area surrounding the first area.

According to a second aspect of the present invention, there is provided a method for manufacturing a semiconductor device formed on the semiconductor-on-insulator substrate as described above. The method includes steps of: induction-heating the meshed semiconductor film selectively from the array of isolated semiconductor film pieces; and dividing the meshed semiconductor film into second isolated film pieces.

With the method according to the present invention, a semiconductor device suitable for use in LCD's is fabricated at a low cost in a high reliability and a good reproducibility.

BRIEF DESCRIPTION OF THE DRAWINGS

The other objects as well as features and advantages of the present invention will be apparent from the following description, referring to the accompanying drawings in which:

FIG. 1A is a schematic plan view of a main surface of a semiconductor-on-insulator substrate, for use in manufacturing a semiconductor device, according to a first embodiment of the present invention;

FIG. 1B is a sectional view taken along the line a—a of FIG. 1D;

FIG. 1C is a sectional view taken along the line b—b of FIG. 1E;

FIG. 1D is an enlarged fragmentary view of a detail of a marginal area of the substrate;

FIG. 1E is an enlarged fragmentary view of a detail of a central area of the substrate;

FIG. 2A is a schematic plan view of a main surface of another substrate according to a second embodiment of the present invention showing the main surface similarly to FIG. 1A;

FIG. 2B is a sectional view taken along the line a—a of FIG. 2D;

FIG. 2C is a sectional view taken along the line b—b of FIG. 2E;

FIGS. 2D and 2E are views similar to FIGS. 1D and 1E respectively, but of the embodiment of FIG. 2A;

FIG. 3A is a plan view showing similarly to FIG. 1A a main surface of a substrate during a step in a method for manufacturing a semiconductor device, according to an embodiment of the present invention;

FIG. 3B is a sectional view taken along the line a—a of FIG. 3D;

FIG. 3C is a sectional view taken along the line b—b of FIG. 3E;

FIGS. 3D and 3E are views similar to FIGS. 1D and 1E respectively, but of the embodiment of FIG. 3A;

FIG. 4A is another schematic plan view of the main surface of the substrate of FIG. 3A for showing similarly to FIG. 3A during a step subsequent to the step of FIG. 3A;

FIG. 4B is a sectional view taken along the line a—a of FIG. 4A;

FIG. 4C is a sectional view taken along the line b—b of FIG. 4A; and

FIGS. 4D and 4E are views similar to FIGS. 1D and 1E respectively, but of the embodiment of FIG. 4A.

DETAILED DESCRIPTION OF THE PREFERRED EMBODIMENTS

Before describing the preferred embodiments of the present invention, the principle of the present invention will be first described for the sake of understanding.

We have previously proposed various methods for forming a semiconductor film of a large chip area and an excellent quality on an insulating substrate, such as a glass substrate, in a series of disclosures including Japanese Patent Laid-Open Publication No. 2(1990)-199817 entitled "High Frequency Annealing Method", Japanese Patent Laid-Open Publication No. 4(1992)-4591 entitled "Induction Heating Apparatus and Induction Heating Method", Japanese Patent Laid-Open Publication No. 4(1992)-34888 entitled "Induction Heating Method", and Japanese Patent Application No. 3(1991)-315855 entitled "Substrate for Semiconductor Device and Method of Manufacturing the Semiconductor Device".

Especially in Japanese Application No. 3(1991)-315855 as mentioned above, we disclosed that, when a semiconductor film formed on an insulating substrate is patterned to a loop having a loop size corresponding to the size of the insulating substrate and having meshes therein, the semiconductor film can be efficiently heated and annealed by the induction heating. That is, the induction heating can efficiently generate a high density eddy current in the meshed semiconductor film without destroying the thereby recrystallized meshed film. Thus, a semiconductor film having a large chip area and an excellent quality can be obtained in a large through-put.

We have continued further research and found that the density of the induced current is very low, during the induction heating, in each of isolated semiconductor film pieces, e.g. isolated small film pieces formed by patterning a semiconductor layer, as compared to a semiconductor film having meshes ( referred to as meshed semiconductor film hereinafter ) provided that the meshed semiconductor film has a size larger than the size of the isolated semiconductor film pieces.

Accordingly, when isolated semiconductor film pieces and a meshed semiconductor film are formed together on a common insulating substrate and subjected to induction heating, the density of eddy current induced in the meshed semiconductor film becomes larger as compared to the isolated semiconductor film pieces, so that the meshed semiconductor film can be selectively heated for recrystallization by induction heating. Utilizing such a technique, it is possible to recrystallize a meshed semiconductor film composed of hydrogenated amorphous silicon or polycrystalline silicon selectively from semiconductor film pieces composed of hydrogenated amorphous silicon or polycrystalline silicon, thereby obtaining a recrystallized meshed semiconductor film having a single crystal structure. Before forming therein semiconductor active regions, the meshed semiconductor film is divided into plural portions each having a desired shape for each of the semiconductor elements such as MOSFET's, thereby obtaining semiconductor elements of a higher performance.

Now, the present invention will be described referring to the preferred embodiments. FIGS. 1A through 1E show a silicon-on-insulator (SOI) substrate according to a first embodiment of the present invention. The substrate comprises a main surface having a pixel area and a drive circuit area on which a semiconductor device is to be fabricated.

In FIGS. 1A, numeral 1 denotes a peripheral drive circuit area disposed at the peripheral portion of the main surface of the insulating substrate 4 and provided with a meshed silicon film 12 on the insulating substrate 4. The meshed silicon film 12 has a plurality of rectangular regions 13 with a space disposed therebetween and a plurality of strip regions 14 each for bridging the rectangular portions 13 together.

Each four rectangular regions 13 are bridged together by corresponding strip regions 14, thereby defining a mesh 15 within the bridged four rectangular regions 13 of the the meshed silicon film 12. The drive circuit area 1 has a constant width, the outer periphery of the drive circuit area 1 being flush with the outer periphery of the main surface of the insulating substrate 4.

Numeral 2 denotes a central pixel area including an array of pixel elements in which isolated silicon film pieces 16 are disposed. Each of the isolated silicon film pieces constitutes an active layer of a thin film transistor. The meshed silicon film 12 and silicon film pieces 16 are formed by patterning a hydrogenated amorphous silicon or polycrystalline silicon layer deposited on an insulating substrate 4. A cap layer 5 such as $SiO_2$ is formed, for example, by CVD (chemical vapor deposition), on the entire surface including the surfaces of the semiconductor films 12 and 15 and the surface of the insulating substrate 4. The insulating substrate 4 may be a non-alkali glass substrate or a quartz glass substrate. The glass substrate may be provided on the surface thereof with an insulating layer of silicon oxide or silicon nitrite by sputterring or CVD method.

We prepared two kinds of quartz glass substrates, one provided with an insulating layer thereon and the other without an insulating layer thereon. We also prepared a non-alkali glass substrate provided with an insulating layer thereon. A hydrogenated amorphous silicon layer was deposited on some of the thus prepared insulating substrate 4 by a plasma enhanced CVD method in a thickness between 0.5 and 2 $\mu$m on the insulating substrate 4 at a temperature between 250° and 300° C. of the substrate. A polycrystalline silicon layer is grown by a LPCVD method on the others of the insulating substrate at in a thickness of between 0.5 and 2 $\mu$m at a temperature between 570° and 600° C. of the substrate.

Subsequently, a known photolithographic etching process was conducted using a mask having a pattern for forming the pattern as illustrated in FIG. 1A. Namely, the layer of hydrogenated amorphous silicon or polycrystalline silicon was selectively etched so that the peripheral region of the silicon layer is formed as meshed silicon film 12 and central region of the silicon layer is divided in an array of isolated silicon film pieces 16.

In case of insulating substrates 4 on which the hydrogenated amorphous silicon films 12 and 16 were formed, the silicon films were subjected to induction heating for 1 to 4 hours to remove hydrogen from the meshed silicon film 12 located at the periphery of the insulating substrate 4 at a temperature between 400° and 500° C. This treatment can prevent a destruction of the silicon film 12 which would otherwise occur during the subsequent induction heating step for recrystallization. The induction heating for dehydrogenation was carried out in a manner such that raising the temperature and reducing the temperature were conducted slowly in about 1 to 3 hours, respectively. In case of the insulating substrate 4 on which the polycrystalline silicon films were formed, the process for dehydrogenation was not conducted.

The cap layer 5 of silicon oxide or silicon nitride was then deposited by CVD or sputterring. The formation of the cap layer 5 is not necessarily required and was omitted in some cases where it was considered unnecessary during the subsequent fabricating steps. The thickness of the cap layer 5 was about 0.5 to 5 $\mu$m. Thus, a SOI substrate according to the first embodiment was obtained.

FIGS. 2A through 2E show another SOI substrate according to a second embodiment of the present invention on which a semiconductor device having a pixel area and a drive circuit area is to be fabricated. In this embodiment, the insulating substrate 4 is provided with grooves or depressions 17 for receiving silicon films 12 and 16 on the main surface of the insulating substrate.

Numeral 6 denotes a peripheral drive circuit area disposed at the peripheral portion of the insulating substrate 4 and provided with a meshed silicon film 12 deposited within the depression formed on the insulating substrate 4. Numeral 7 denotes a central pixel area in which isolated silicon film pieces 16 are deposited within the respective depressions 18 formed on the insulating substrate 4.

The other configuration of the second embodiment is similar to that of the first embodiment. Thus, the detailed description thereof is not made here to avoid duplication. Similar reference numerals are used between FIGS. 1A through 1E and FIGS. 2A through 2E.

The SOI substrate of FIGS. 2A through 2E is manufactured as follows: First, a usual photolithographic etching process is conducted to a glass substrate using a mask having a pattern for forming the pattern as shown in FIG. 2A. Namely, the main surface of the glass substrate was etched to form a depression 17 having a meshed pattern at the peripheral area 6 of the glass substrate and having an array of isolated depressions 18 at the central area of the substrate. The depth of the depressions 17 and 18 was selected between 0.5 and 2 $\mu$m. Each of the glass substrates was then provided or not provided with a layer of silicon oxide or a layer of silicon nitride by CVD or sputterring. The silicon oxide or silicon nitride layer 5 was formed in a thickness between 0.05 and 0.2 $\mu$m Subsequently, a silicon layer of hydrogenated amorphous silicon or polycrystalline silicon was deposited on the entire main surface of the insulating substrate 4. A hydrogenated amorphous silicon layer was grown by plasma enhanced CVD in a thickness between 0.5 and 2 $\mu$m on the substrate 4 at a temperature between 250° and 300° C. of the substrate. The polycrystalline silicon layer was deposited by LPCVD in a thickness between 0.5 and 2 $\mu$m on the substrate at a temperature between 570° and 600° C. of the substrate. The amorphous silicon layer has an advantage over a polycrystalline silicon layer that the amorphous silicon layer has a smaller leakage current when formed as an active layer in a pixel area of a LCD.

Then, a known photolithographic etching process was conducted using a mask having a pattern to form the pattern of the silicon films as shown in FIG. 2A. Thus, the patterned silicon films 12 and 16 of hydrogenated amorphous silicon or polycrystalline silicon was formed filling the depressions 17 and 18. When the surface thus obtained had irregularities caused by the process of photolithographic etching, the surface was ground by mechanical-chemical polishing.

In case of the insulating substrates on which the hydrogenated amorphous silicon films 12 and 16 were formed, the substrate was subjected to induction heating for 1 to 4 hours to remove hydrogen from the meshed silicon film 12 located at the periphery of the insulating substrate 4 at a temperature between 400° and 500° C. This treatment can prevent a destruction of the silicon film 12 which would otherwise occur during the subsequent induction heating step for recrystallization. The induction heating for dehydrogenation was carried out in a manner such that raising the temperature and reducing the temperature were conducted slowly in about 1 to 3 hours, respectively. In case of the insulating substrate on which the polycrystalline silicon films 12 and 16 were formed, the process for dehydrogenation was not conducted.

The cap layer 5 of silicon oxide or silicon nitride was then deposited by CVD or sputterring. The formation of the cap layer 5 is not necessarily required and was omitted in some cases where it was considered unnecessary in the subsequent fabricating steps. The thickness of the cap layer 5 was about 0.5 to 5 $\mu$m. By the steps as described above, the SOI substrate of FIGS. 2A through 2E was obtained.

FIGS. 3A through 3E show the SOI substrate as described above during a step in the method of manufacturing a semiconductor device according to an embodiment of the present invention using the SOI substrate. In these figures, numeral 22 denotes a meshed silicon film which was annealed by high-frequency induction heating. Before the step as shown in these drawings, the substrate having a structure as shown in FIGS. 1A through 1E is annealed by the method, for example, as disclosed in Japanese Patent Laid-Open Publication 2 (1990)-199817 entitled "High Frequency Annealing Method". Specifically, the meshed silicon film of hydrogenated amorphous silicon or polycrystalline silicon is annealed for 2 minutes at a temperature above about 1400° C., the melting point of Si, by high-frequency induction heating at 8 KW and 55 KHz, so that the silicon meshed film 22 changed from amorphous silicon or polycrystalline silicon to a single crystal silicon as schematically illustrated FIGS. 3A and 3B. In this change, the quality of the silicon meshed film is drastically improved as compared to the quality of the previous meshed silicon film. Thereafter, known photolithographic etching was carried out to divide the meshed silicon film 22 to plural rectangular regions 23 each having a desired shape for forming a semiconductor element.

FIGS. 4A through 4E show the SOI substrate during a step after the step of FIGS. 1A through 1E. Numeral 10 denotes a peripheral drive circuit area in which the meshed silicon film has been divided into rectangular regions 23 by removing the strip regions 24 by photolithography. Each of the rectangular silicon regions 23 has a desired shape for forming a transistor therein. The isolated silicon film pieces 16 in the central pixel area 2 remains unchanged during the induction heating. Then, semiconductor elements are formed in each of the drive circuit area and the pixel area by a sequence of known steps for forming a semiconductor device for use in a LCD.

The SOI substrates according to the embodiments of the present invention enables manufacturing a reliable and reproducible semiconductor device for use in LCD including a pixel area having thin film transistors made of hydrogenated amorphous silicon or polycrystalline silicon and a drive circuit area having thin film transistors made of single crystal silicon and having a higher performance. Accordingly, an LCD, which employs the above-described semiconductor device of a higher performance and a higher reliability, can be manufactured at a low cost.

Since above description is given only for examples, the present invention is not limited to only the above embodiments and various modifications or alterations can be made from the embodiments without departing from the scope of the present invention.

What is claimed is:

1. A semiconductor-on-insular substrate comprising:
    an insulating substrate having a main surface including a first central area and a second peripheral area;
    an array of isolated semiconductor film pieces formed only on said first central area; and
    a continuous semiconductor film having a plurality of openings formed therein to define a meshed semiconductor film and formed on said second area, whereby said meshed semiconductor film causes said second area to be more readily susceptible to induction heating than said first area.

2. A semiconductor-on-insulator substrate as defined in claim 1 wherein said semiconductor films are composed of silicon.

3. A semiconductor-on-insulator substrate as defined in claim 2 wherein said silicon is in the state selected from the state of hydrogenated amorphous silicon and polycrystalline silicon.

4. A semiconductor-on-insulator substrate as defined in claim 1 wherein said mesh is defined by edges of a plurality of rectangular regions and edges of a plurality of strip regions each bridging said rectangular regions.

5. A semiconductor-on-insulator substrate as defined in claim 1 further comprising a cap layer formed on said semiconductor films and said main surface.

6. A semiconductor-on-insulator substrate as defined in claim 1 wherein said insulating substrate comprises a glass substrate and an insulating film formed on said glass substrate, the surface of said insulating film constituting said main surface.

7. A semiconductor-on-insulator substrate as defined in claim 1 wherein the thickness of said semiconductor films is between about 0.5 μm and 2.0 μm.

8. A semiconductor-on-insulator substrate as defined in claim 1 wherein said main surface has depressions receiving said semiconductor films.

* * * * *